United States Patent [19]

Nakano et al.

[11] Patent Number: 4,980,223

[45] Date of Patent: Dec. 25, 1990

[54] SHEET FOR FORMING ARTICLE HAVING ELECTROMAGNETIC WAVE SHIELDABILITY

[75] Inventors: Toshihiko Nakano, Kashiwara; Shoichi Makimoto, Sennan; Hiroyoshi Nanri, Osaka; Kazuhiro Ogawa, Matsubara; Haruhiro Fukuda, Tondabayashi, all of Japan

[73] Assignees: Toyo Aluminium Kabushiki Kaisha; Tsutsunaka Plastic Industry Co. Ltd., both of Osaka, Japan

[21] Appl. No.: 384,591

[22] Filed: Jul. 25, 1989

[30] Foreign Application Priority Data

Jul. 27, 1988 [JP] Japan .................................. 63-189375
Apr. 25, 1989 [JP] Japan .................................. 1-106298

[51] Int. Cl.$^5$ .......................... H05K 9/00; B32B 3/10; B32B 7/14
[52] U.S. Cl. ............................. 428/198; 174/35 MS; 174/35 R; 174/36; 428/201; 428/209; 428/182; 428/184; 428/166; 428/167; 428/178; 428/458; 428/461; 428/463; 428/214; 428/215; 428/920; 428/921
[58] Field of Search ................ 174/35 MS, 35 R, 36; 428/198, 201, 209, 182, 184, 166, 167, 178, 458, 461, 463, 214, 920, 921, 215

[56] References Cited

U.S. PATENT DOCUMENTS

| | | | |
|---|---|---|---|
| 3,754,094 | 8/1973 | Ziemek et al. | 174/36 |
| 4,647,714 | 3/1987 | Goto | 428/681 X |
| 4,654,755 | 3/1987 | Henderson et al. | 174/35 MS |
| 4,678,699 | 7/1987 | Kritchevsky et al. | 174/35 MS |
| 4,749,625 | 6/1988 | Obarashi et al. | 174/35 MS |
| 4,767,673 | 8/1988 | Nakano et al. | 428/458 |
| 4,868,033 | 9/1989 | Nakano et al. | 428/201 |

OTHER PUBLICATIONS

IBM Disclosure, vol. 19, No. 11, Apr. 1977, R. J. McDonald & T. W. Nash.

Primary Examiner—Ellis P. Robinson
Assistant Examiner—William P. Watkins, III
Attorney, Agent, or Firm—Armstrong, Nikaido, Marmelstein, Kubovcik & Murray

[57] ABSTRACT

A forming sheet for forming an article such as a housing for an electronic device having a shieldability against electromagnetic interference. It is made by laminating a conductive laminated sheet to a thermoplastic synthetic resin sheet through a hot melt adhesive layer. The conductive laminated sheet is formed by subjecting to heat shrinkage a substrate comprising a metallic film and a heat-shrinkable synthetic resin film laminated together through a discontinuous bonding layer. The conductive layer is less liable to crack due to stress applied during forming.

8 Claims, 2 Drawing Sheets

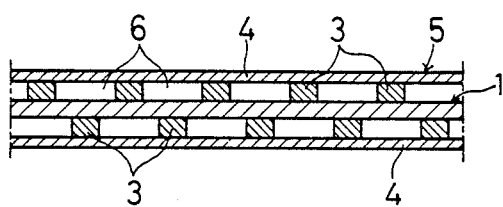
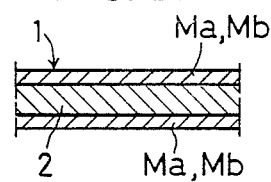
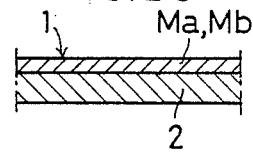
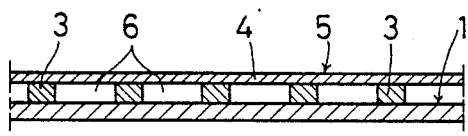
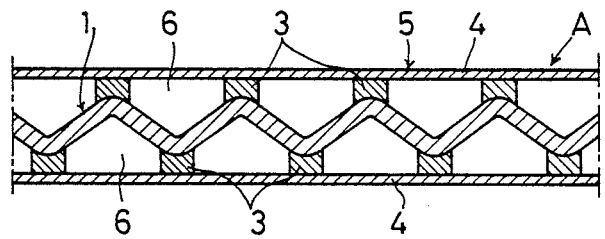
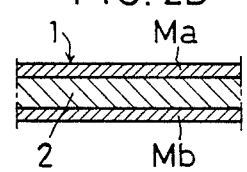
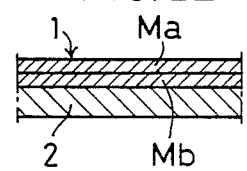
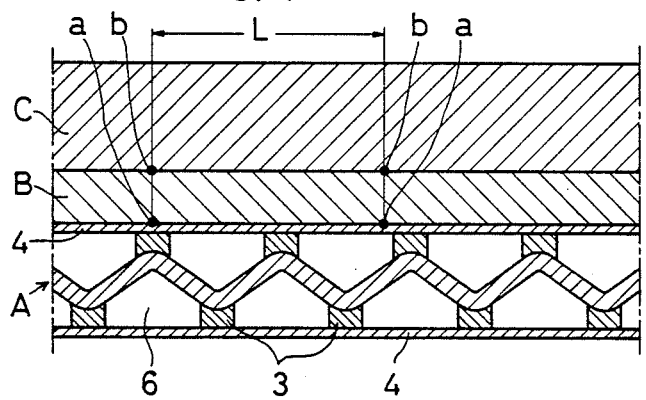
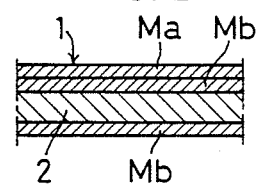

SHEET FOR FORMING ARTICLE HAVING ELECTROMAGNETIC WAVE SHIELDABILITY

The present invention relates to a formed article having a high shieldability against electromagnetic interference (hereinafter referred to as EMI) for use as a housing of an electronic device and a forming sheet suitable for forming such an article by vacuum forming or pressure forming.

A forming sheet used to be formed into an article having a high shieldability against EMI such as a housing of an electronic device is also required to have a good electrical conductivity. For this purpose, such a sheet has heretofore been made by kneading metal in the form of fiber or flakes into a thermoplastic resin so as to be uniformly dispersed in the resin or by laminating a thermoplastic resin and a conductive non-woven fabric together.

When forming such a sheet by vacuum forming or by pressure forming, it tends to be stretched so much particularly at the corners of a forming mold that a large stress will act locally on its conductive layer. This may cause the conductive layer to tear or the sheet to develop cracks. Further, in recent years, an article formed from such a sheet is required to have flame resistance.

It is an object of the present invention to provide a forming sheet which is easy to form and in which its conductive layer provided to impart the shieldability to the sheet is less liable to tear.

Another object of the present invention is to provide an article formed from such a forming sheet which has a good shieldability as well as a good flame resistance.

In accordance with the present invention, there is provided a forming sheet having a shieldability against electromagnetic interference, comprising a conductive laminated sheet and a thermoplastic synthetic resin sheet laminated to at least one side of the conductive laminated sheet through a hot melt adhesive layer having a thickness of 30 to 200 microns, the conductive laminated sheet being made by subjecting to heat shrinkage a substrate comprising a metallic film and a heat-shrinkable synthetic resin film laminated to at least one side of the metallic film through a discontinuous bonding layer.

The thermoplastic synthetic resin sheet may be provided on either one or both sides of the conductive laminated sheet.

The forming sheet according to the present invention has an improved flame resistance by admixing a flame retardant to the hot melt adhesive layer.

The conductive laminated sheet has an electrical conductivity owing to the provision of the metallic layer. The metallic layer will develop a multiplicity of fine wrinkles as a result of shrinkage of the heat-shrinkable synthetic resin.

When forming such a sheet into an article, the conductive laminated sheet will be subjected to stretching. But the metallic layer forming the conductive layer will be protected against tear because the wrinkles formed thereon beforehand absorb elongation.

Though the conductive laminated sheet and the thermoplastic synthetic resin sheet are elongated to different degrees from each other during the forming, such a difference in elongation will be absorbed by the fluidization of the hot melt adhesive layer by heat during forming. The article thus formed will have a good appearance.

The thermoplastic synthetic resin sheet is made of a vinyl chloride resin and the hot melt adhesive layer having flame resistance is used. Thus, no peeling will take place between the conductive laminated sheet and the thermoplastic synthetic resin sheet when the forming sheet is burnt. As a result, the forming sheet has a good flame resistance as a whole.

If the metallic film has a synthetic resin layer, the synthetic resin should preferably be polyethylene terephthalate which has a good heat resistance. In this arrangement, the elongation of the metallic film during forming is reduced to a minimum, thus preventing the layer from cracking. This will assure high shieldability against EMI without causing any crack in the metallic layer.

A higher shielding effect will be expected if the conductive laminated sheet is made of a metallic film comprising a synthetic resin layer provided with a metallized layer and a metallic foil laminated thereto or is provided in two or more layers.

Other features and objects of the present invention will become apparent from the following description taken with reference to the accompanying drawings, in which:

FIGS. 1a and 1b are sectional views of the conductive laminated sheet before being subjected to heat shrinkage;

FIGS. 2a to 2f are sectional views of the metallic films of different types;

FIG. 3 is a sectional view of the conductive laminated sheet of FIG. 1a after being subjected to heat-shrinkage;

FIG. 4 is a sectional view of the forming sheet in one embodiment of the present invention;

Figure 5:
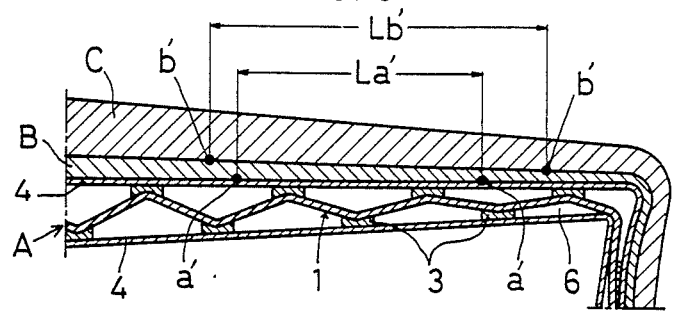
FIG. 5 is a partial sectional view of the forming sheet of FIG. 4 showing the state after forming.

The forming sheet according to the present invention comprises a conductive laminated sheet A, a hot melt adhesive layer B and a thermoplastic synthetic resin sheet C. (FIG. 4)

The conductive laminated sheet A is made by heating to shrink a substrate 5 including a metallic film 1 and a heat-shrinkable synthetic resin film 4 laminated to both sides or one side of the metallic film 1 through a discontinuous bonding layer 3 as shown in FIGS. 1a and 1b, respectively.

The metallic film 1 may be a single-layered metallic foil Ma 3 to 15 microns thick as shown in FIG. 2a. It may comprise a synthetic resin layer 2 and either a 0.02 to 3 micron thick metallized layer Mb or a 3 to 15 microns thick metallic foil layer Ma formed or laminated on both or one side of the synthetic resin layer 2. FIG. 2b shows a metallic film 1 having a metallized layer Mb or a metallic foil layer Ma formed on both sides of the synthetic resin layer 2. FIG. 2c shows a metallic film 1 having the layer Mb or Ma formed on one side of the synthetic resin layer 2.

Also, the metallic film 1 may be a laminate having the synthetic resin layer 2, the metallized layer Mb, and the metallic foil Ma. FIGS. 2d shows an example in which the metallic foil Ma is laminated to one side of the synthetic resin layer 2 and the metallized layer Mb is formed on the other side thereof. FIG. 2e shows another example in which the metallized layer Mb is formed on one side of the synthetic resin layer 2 and the metallic foil Ma is further laminated to the metallized layer Mb. In the example of FIG. 2f, the metallic film 1 has the metallized layers Mb formed on both sides of the synthetic resin layer 2 and the metallic foil Ma is laminated to one of the metallized layers Mb.

FIGS. 1a and 1b show two different kinds of substrates 5 before being subjected to heat shrinkage and FIG. 3 shows the substrate of FIG. 1a after subjected to heat shrinkage.

The metallic layer forming the metallic film 1 may be a metallic foil such as an aluminium foil or a copper foil or a metallized layer of aluminium or tin. The total thickness of the metallic layer or layers should be not less than 0.02 micron so that they can effectively shield EMI after forming and should preferably be more than 0.1 micron. But it should not be more than 15 microns from an economical viewpoint.

The synthetic resin layer 2 forming the metallic film 1 may be of a single-layer or a multi-layer construction and should be made of polyethylene, polypropylene, vinyl chloride, polystyrene, acrylate, polyethylene terephthalate (abbreviated to PET in the Table) or ethylene-vinyl acetate copolymer. Polyethylene terephthalate which has a high heat resistance is the most preferable. The thickness of the synthetic resin layer should be 4 to 25 microns.

The metallic film 1 may be made either by coating the synthetic resin layer 2 on the metallic layers or by laminating the resin layer to the metallic layer if the metallic layer is a metallic foil. If it is a metallized layer, the synthetic resin layer 2 may be metallized.

The heat-shrinkable synthetic resin film 4 should preferably be made of a resin selected from polyethylene, polypropylene (abbreviated to PP in the Table), vinyl chloride, polystyrene and polyester resins and having as large a shrinkage ratio as possible (e.g. 50 per cent). It may be of a single-layer construction or a laminate of two or more films.

The discontinuous bonding layer 3 should be of any adhesive material capable of bonding the metallic film 1 and the heat-shrinkable synthetic resin film 4 together. Also, they may be bonded together discontinuously by heat sealing or ultrasonic sealing. The discontinuous bonding layer 3 may have a linear, dotted, lattice or any other pattern, as viewed from top, so long as it is not present over the entire interface between the metallic film 1 and the synthetic resin films 4 but is formed so as to leave voids 6.

The hot melt adhesive layer B should be made of an olefin adhesive or a mixture of olefin adhesives such as ethylene-vinyl acetate (abbreviated to EVA in the Table), ethylene-acrylic acid ester copolymer, ethylene ionomer, and polyethylene.

Further, in order to impart flame resistance to the forming sheet, at least one flame retardant selected from the group consisting of tricresyl phosphate, tris (chloroethyl) phosphate, tris (dichloropropyl) phosphate, tris (dibromopropyl) phosphate, triphenyl phosphate, decabromodiphenyl ether, chlorinated paraffin and antimony oxide may be mixed into the olefin adhesives.

The content of the flame retardant in the hot melt adhesive layer B should be 20-70 per cent by weight, preferably 40-60 per cent by weight. If less than 20 percent, the flame retardance will be insufficient. If more than 70 percent, the cost will be too high.

The layer B should have a thickness of 30-200 microns, preferably 50-150 microns. If less than 30 microns, it cannot damp the stress owing to any displacement during forming. If more than 200 microns, the cost will be too high.

The thermoplastic synthetic resin sheet C should be made of a vinyl chloride, methyl methacrylate, acrylonitrile-butadiene-styrene, polystyrene, polycarbonate or modified polyphenylene oxide resin.

Further, for better flame resistance, the thermoplastic synthetic resin sheet C should preferably be made of a vinyl chloride resin having an excellent flame resistance. Its thickness is normally 3.0 to 5.0 mm, but not limited thereto.

The conductive laminated sheet A, the hot melt adhesive layer B and the thermoplastic synthetic resin sheet C may be laminated together by various means. For example, while the thermoplastic synthetic resin sheet C is being extruded, the conductive laminated sheet A may be continuously laminated thereon through the hot melt adhesive layer B. Or the conductive laminated sheet A, the hot melt adhesive layer B and the thermoplastic synthetic resin sheet C may be put one upon another and laminated together by hot pressing.

The forming sheet thus made may be formed while heating by vacuum forming or pressure forming so that the thermoplastic synthetic resin layer C will serve as the working surface of the formed article.

With reference to FIGS. 4 and 5, it shall be described how the different layers will function when the forming sheet of the present invention is formed.

Before forming, the conductive laminated sheet A is bonded to the thermoplastic synthetic resin sheet C through the hot melt adhesive layer B.

The rate of elongation of the thermoplastic synthetic resin sheet C during forming is larger than that of the conductive laminated sheet A because the latter is formed by heat-shrinkage. The difference in elongation is especially remarkable at the corners and the uprising portions of the forming mold. For example, the points a—a and b—b in FIG. 4 before forming will move to the points a'—a' and b'—b' in FIG. 5, respectively, after forming. The distances L between points a—a and between points b—b will increase to La' and Lb', respectively. During forming, the hot melt adhesive layer B is heated and fluidized. The difference in elongation between the conductive laminated sheet A and the thermoplastic synthetic resin sheet C at their respective interfaces with the adhesive layer B (i.e. $L < La' < Lb'$) is absorbed by the fluidity of the adhesive layer B without imparing its bond performance. The resulting formed article sheet will thus have a beautiful appearance.

No practical problem will occur even if the heat-shrinkable synthetic resin film 4 is broken while forming, as far as the metallic film 1 of the conductive laminated sheet A remains unbroken. When forming, the conductive laminated sheet A, which has been wrinkled by heat shrinkage, will be stretched. Unless it is stretched taut completely, the laminated sheet A will remain wrinkled even after forming. But this will not pose any practical problems.

We prepared two different forming sheets, one including the metallic film 1 made of a synthetic resin having a metallized layer formed thereon and the other including the metallic film 1 made of a synthetic resin having a metallic foil laminated thereon. As a result of tests, it was found out that when the sheet was stretched beyond the point where the wrinkles disappear, they showed different behaviors from each other. With the former sheet, no apparent breakage or crack of the metallized layer was observed whereas with the latter sheet, the metallic foil sometimes develops cracks. But even such a cracked metallic foil was found out to have a good shielding effect against EMI.

Figure 6A:
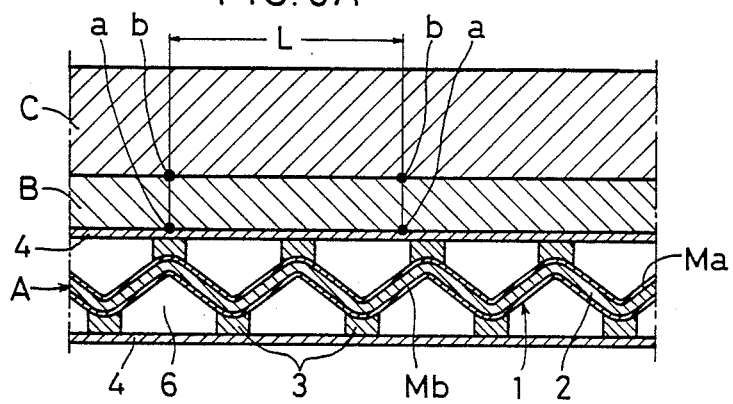
FIGS. 6a and 6b are sectional views of the forming sheets in other embodiments.

Accordingly, in the embodiment shown in FIG. 6a, the metallic film 1 of the conductive laminated sheet A is made of a synthetic resin layer 2 having a metallic foil Ma formed on its side facing the thermoplastic synthetic resin sheet C and a metallized layer Mb formed on the other side. The formed piece formed from this sheet had a good appearance and high shielding effect against EMI.

Figure 6B:
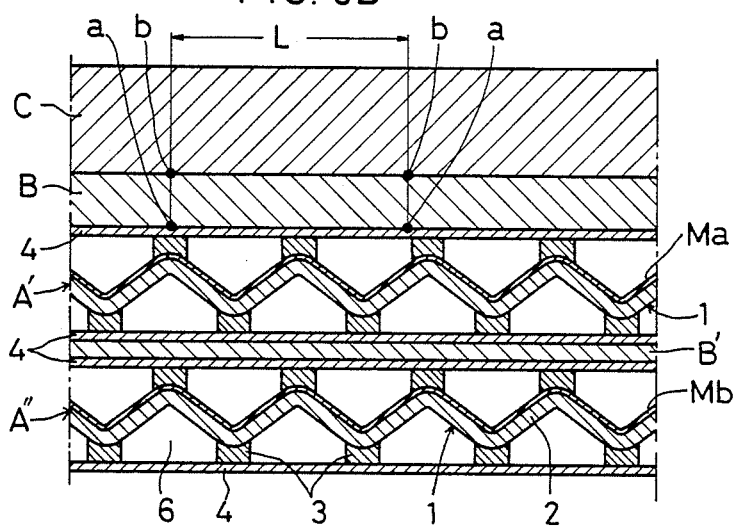

Also, in another embodiment shown in FIG. 6b, two conductive laminated sheets A' and A" are laminated together after subjecting them to heat shrinkage. The former sheet A' comprises a metallic film 1 which is a metallic foil Ma, and a heat-shrinkable synthetic resin film 4 laminated to both sides of the metallic foil Ma through discontinuous bonding layers 3, and the latter sheet A" comprises a metallic film 1 having a synthetic resin layer 2 and a metallized layer Mb formed on at least one side thereof, and heat-shrinkable synthetic resin films 4 laminated to both sides of the metallic film 1 through discontinuous bonding layers 3.

The sheet A' may be laminated to the synthetic resin sheet C through the adhesive layer B, after laminated to the sheet A".

The conductive laminated sheets A' and A" may be bonded together by sealing their heat-shrinkable synthetic resin films 4 together or bonding through a hot melt adhesive layer B' similar to the adhesive layer B.

Tables 1 and 2 show the structure and the test results of the embodiments 1-7 according to the present invention and the comparison examples 1 to 5 prepared for comparison purposes.

The articles formed from the sheets in embodiments 1-3 had a good appearance on both sides. Neither breakage nor peeling of their metallic film was observed even at the corner portions on the back side.

With the article formed in the embodiment 4, though cracks were partially observed at its back side after forming, it showed an excellent shieldability against EMI. The formed articles in embodiments 5 and 6 also showed a high shieldability against EMI and had a good appearance on the back.

The formed article in the embodiments 4 and 7 each including a hot melt adhesive layer B composed of

| | |
|---|---|
| EVA (MI 0.8 g/10 min, VA cont 20%) | 50 percent by weight |
| Decabromodiphenyl ether | 25 percent by weight |
| $Sb_2O_3$ | 25 percent by weight | were found to clear the UL 94 V-0 (Underwriters Laboratory's Standard).

The formed article in the embodiments 5 and 6 each including a hot melt adhesive layer B composed of

| | |
|---|---|
| EVA (MI 0.8 g/10 min, VA cont 20%) | 40 percent by weight |
| Decabromodiphenyl ether | 24 percent by weight |
| $Sb_2O_3$ | 36 percent by weight | were also found out to clear the UL 94 V-0.

In contrast, with the comparison examples 1, 3, 4 and 5, peeling was observed between the conductive laminated sheet A and the thermoplastic synthetic resin sheet C at the corners of the back side to such a degree as to ruin the appearance of the end product and thus lower its commercial value.

The comparison example 2 achieved a satisfactory result in formability. But the end product failed to reveal a sufficient shieldability against EMI. Moreover, peeling was observed between the sheets A and C during a burning test and its flame resistance was so poor that it meets the requirements corresponding to only the UL 94 HB.

The EMI shielding effect of each formed article was determined by measuring the attenuation (in dB) in an electric field of 30 to 1000 MHz produced by a transmitter mounted in a copper cabinet on one side of which the article was mounted. The attenuation was measured by use of a receiving antenna provided at a distance of 3 meters from the transmitter, and a spectrum analyzer.

TABLE 1

| Embodiment | 1 | 2 |
|---|---|---|
| Conductive laminated sheet A | | |
| Synthetic resin layer (thickness) | PET (9 μm) | PET (9 μm) |
| Metallic layer (total thickness) | Al metallized (800 Å) | Al metallized (1200 Å) |
| Synthetic resin film (thickness) | PP (20 μm) | PP (20 μm) |
| Hot melt adhesive layer B (thickness) | EVA (100 μm) | EVA (100 μm) |
| Thermoplastic synthetic resin sheet C (thickness) | Vinyl chloride resin (5.0 mm) | Vinyl chloride resin (5.0 mm) |
| Laminating condition | Extrusion lamination with a single-screw extruder (40 mm dia. L/D 22) Resin temperature: 180° C. Laminating pressure: 20 kg/cm² (Press wire pressure) | |
| Forming condition | Pressure forming female mold: 4-fold 185° C. (surface) | Vacuum forming female mold: 2.1-fold 190° C. (surface) |
| Test Results | | |
| Appearance | good | good |
| Attenuation (in dB) 30-1000 MHz | 20-40 dB | 30-50 dB |
| Flame Resistance (UL-94) | meet V-1 | meet V-1 |

TABLE 2

| | 3 | 4 | 5 |
|---|---|---|---|
| | PET (9 μm) | — | PET (9 μm) |
| | Al metallized (1200 Å) | Al foil (5.5 μm) | Al foil + Al metallized (5.56 μm) |
| | PP (20 μm) | PP (20 μm) | PP (40 μm) |
| | EVA (100 μm) | EVA containing flame retardant (100 μm) | EVA containing flame retardant (100 μm) |
| | Vinyl chloride resin (3.0 mm) | Vinyl chloride resin (5.0 mm) | Vinyl chloride resin (5.0 mm) |
| | | Hot press at 180° C. 10 minutes 10 kg/cm² (surface pressure) | |
| | Pressure forming female mold: 2.1-fold 190° C. (surface) good | Pressure forming female mold: 2.1-fold 185° C. (surface) good | Pressure forming female mold: 3-fold 185° C. (surface) good |

TABLE 2-continued

| 3 | 4 | 5 |
|---|---|---|
| | (partially cracked) | |
| 30–50 dB | 60 dB or more | 60 dB or more |
| meet HB | meet V-0 | meet V-0 |

| | 6 | 7 |
|---|---|---|
| | — | PET (9 μm) | PET (9 μm) |
| | Al foil (5.5 μm) | Al metallized (600 Å) | Al metallized (1200 Å) |
| | PP (20 μm) | PP (20 μm) | PP (20 μm) |
| | | EVA containing flame retardant (100 μm) | EVA containing flame retardant (100 μm) |
| | Vinyl chloride resin (5.0 mm) | Vinyl chloride resin (5.0 mm) | Vinyl chloride resin (5.0 mm) |
| | Hot press at 180° C. 10 minutes 10 kg/cm² (surface pressure) | | |
| | Pressure forming female mold: 3-fold 185° C. (surface) | Pressure forming female mold: 2.1-fold 190° C. (surface) | |
| | good | good | |
| | 60 dB or more | 30–50 dB | |
| | meet V-0 | meet V-0 | |

TABLE 2

| Comparative Example | 1 | 2 | 3 | 4 | 5 |
|---|---|---|---|---|---|
| Conductive laminated sheet A | | | | | |
| Synthetic resin layer (thickness) | PET (9 μm) | PET (9 μm) | PET (9 μm) | — | Vinyl chloride resin sheet with metal kneaded |
| Metallic layer (total thickness) | Al metallized (1200 Å) | Al metallized (100 Å) | Al metallized (1200 Å) | Al foil (17 μm) | Copper fiber 50 wt % diameter 30 μm length 2 μm |
| Syntetic resin film (thickness) | PP (20 μm) | PP (20 μm) | PP (20 μm) | PP (40 μm) | |
| Hot melt adhesive layer B (thickness) | Epoxy resin applied 300 g/m² | EVA (100 μm) | EVA (20 μm) | EVA (100 μm) | EVA (100 μm) |
| Thermoplastic synthetic resin sheet C (thickness) | Vinyl chloride resin (5.0 mm) | Vinyl chloride resin (3.0 mm) | Vinyl chloride resin (5.0 mm) | Vinyl Chloride resin (5.0 mm) | Vinyl chloride resin (3.0 mm) |
| Laminating condition | Hot press at 180° C. 10 minutes 10 kg/cm² (surface pressure) | | | | |
| Forming condition | Vacuum forming female mold 2.1-fold 190° C. (surface) | Pressure forming female mold 2.1-fold 185° C. (surface) | Pressure forming female mold 2.1-fold 185° C. (surface) | Pressure forming female mold 2.1-fold 185° C. (surface) | Pressure forming female mold 4-fold 185° C. (surface) |
| Test Results | | | | | |
| Appearance | bad (delamination at corners) | good | bad (delamination at corners) | bad (broken at whole surface) | bad |
| Attenuation (in dB) 30–1000 MHz | 30–60 dB | 0–15 dB | 30–50 dB | — | 10–20 dB |

What is claimed is:

1. A forming sheet having a shieldability against electromagnetic interference, comprising a conductive laminated sheet and a thermoplastic synthetic resin sheet laminated to at least one side of said conductive laminated sheet through a hot-melt adhesive layer having a thickness of 30 to 200 microns, said conductive laminated sheet comprising a metallic film, a heat-shrinkable synthetic resin film laminated to at least one side of said metallic film, a discontinuous bonding layer securing said heat shrinkable synthetic resin film to said metallic layer, and a plurality of void spaces defined by surfaces of the metallic film, the heat-shrinkable synthetic resin film and the discontinuous bonding layer, said conductive laminated sheet is heat shrunk, and said hot-melt adhesive layer is made of a polyolefin resin and contains 20–70 weight percent of at least one flame retardant selected from the group consisting of tricresyl phosphate, tris (chloroethyl) phosphate, tris (dichloropropyl) phosphate, tris (dibromopropyl) phosphate, triphenyl phosphate, decabromodiphenyl ether, chlorinated paraffin and antimony oxide.

2. A forming sheet as claimed in claim 1, wherein said metallic film comprises a synthetic resin layer and a metallized layer formed on at least one side of said synthetic resin layer, said metallized layer having a thickness of 0.02 to 3 microns.

3. A forming sheet as claimed in claim 1, wherein said metallic film is a metallic foil having a thickness of 3 to 15 microns.

4. A forming sheet as claimed in claim 1, wherein said metallic film comprises a synthetic resin layer, a metallized layer formed on at least one side of said synthetic resin layer and having a thickness of 0.02 to 3 microns, and a metallic foil having a thickness of 3 to 15 microns.

5. A forming sheet as claimed in claim 1, wherein said conductive laminated sheet is provided in two or more layers.

6. A forming sheet as claimed in claim 2 or 4, wherein said synthetic resin layer is made of polyethylene terephthalate.

7. A forming sheet as claimed in claim 1, wherein said thermoplastic synthetic resin sheet is a vinyl chloride resin.

8. An article made by forming the forming sheet as claimed in claim 1.

* * * * *